United States Patent [19]

Pieverling et al.

[11] 4,015,251

[45] Mar. 29, 1977

[54] CIRCUIT ARRANGEMENT FOR THE DIGITALIZATION OF AN ANGLE OR ROTATION

[75] Inventors: Klaus V. Pieverling, Wolfratshausen-Waldram; Gerhard Klemt, Munich; Bruno Maier, Munich; Dieter Leypold, Munich, all of Germany

[73] Assignee: Siemens Aktiengesellschaft, Berlin & Munich, Germany

[22] Filed: Feb. 10, 1975

[21] Appl. No.: 548,861

[30] Foreign Application Priority Data

Feb. 18, 1974 Germany .......................... 2407678

[52] U.S. Cl. .................. 340/347 SY; 340/347 AD; 318/661
[51] Int. Cl.² ....................................... H03K 13/02
[58] Field of Search ............. 340/347 SY, 347 AD; 318/654, 661; 307/291; 333/29

[56] References Cited

UNITED STATES PATENTS

| | | | |
|---|---|---|---|
| 2,894,256 | 7/1959 | Kronacher | 340/347 SY |
| 2,933,722 | 4/1960 | Steinman | 340/347 SY |
| 3,377,589 | 4/1968 | Materer et al. | 340/198 X |
| 3,609,569 | 9/1971 | Todd | 307/291 |
| 3,612,977 | 10/1971 | Perrett | 318/654 |
| 3,636,554 | 1/1972 | Farneth | 340/347 SY |
| 3,851,330 | 11/1974 | Huber | 340/347 SY |
| 3,914,760 | 10/1975 | Logue | 340/347 AD |

Primary Examiner—Thomas J. Sloyan
Attorney, Agent, or Firm—Hill, Gross, Simpson, Van Santen, Steadman, Chiara & Simpson

[57] ABSTRACT

A circuit arrangement for the digitalization of the angle of rotation $\phi$ of a rotatable device which is operated at $fa$ rotations per second, employing auxiliary voltages modulated with sin $\phi$ and cos $\phi$ of a fundamental frequency $fo$, which with the aid of further circuit elements are converted into a counter pulse train which indicates the angle of rotation, in which $n$ pulses correspond to the angle of rotation of 360°; wherein from two auxiliary voltages is formed a third auxiliary voltage which contains only one of the frequencies $(fo+fa)$ or $(fo-fa)$, which third auxiliary voltage and a comparison voltage of the frequency $n \cdot fo$ are conducted to a comparator circuit, comprising a D-flip-flop, with the comparison voltage being present at the D-input (preparation input) and the third auxiliary voltage being present at the clock-input, whereby the desired counter pulse train with $n \cdot fa$ is obtained at the output of the D-flip-flop.

17 Claims, 5 Drawing Figures

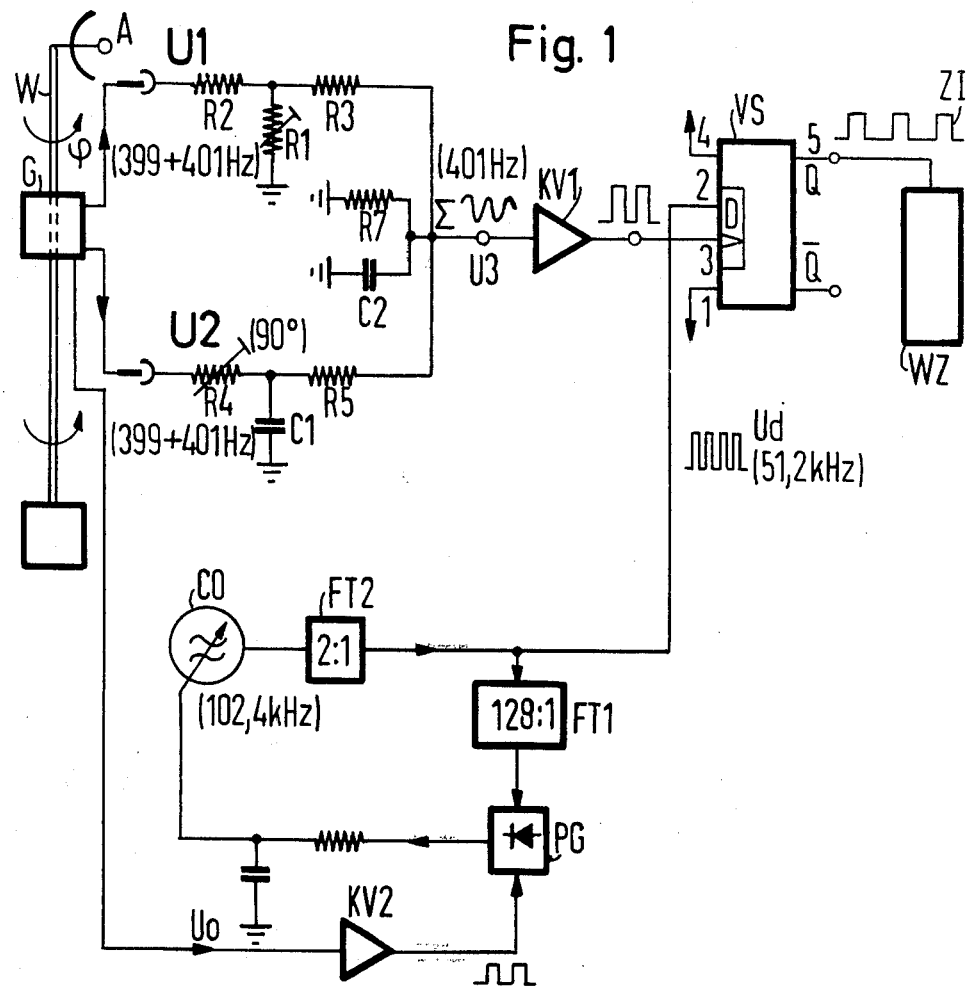
Fig. 1
Fig. 2
a)
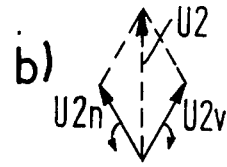
b)
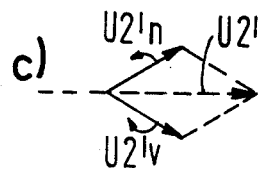
c)
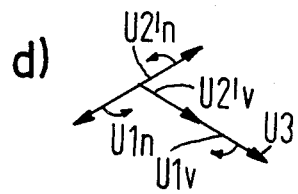
d)

CIRCUIT ARRANGEMENT FOR THE DIGITALIZATION OF AN ANGLE OR ROTATION

BACKGROUND OF THE INVENTION

The invention is directed to a circuit arrangement for the digitalization of the angle of rotation $\phi$ of a rotatable device which is operated with $fa$ rotations per second, employing auxiliary voltages which are modulated with the sin $\phi$ and the cos $\phi$ of a fundamental frequency $fo$, and which, by means of additional circuit elements, are transformed into a counter pulse train which represents the angle of rotation, in which $n$ pulses correspond to the angle of rotation of 360°.

German OS 2 054 553 (UK Patent Application 54305-69, filed Nov. 5, 1969) describes a device for deriving the angular position of a rotatable device, employing two auxiliary voltages, one of which fulfills the function $U1 = \sin \phi \cdot \sin 2\pi fo \cdot t$, while the second voltage fulfills the function $U2 = \cos \phi \cdot \cos 2\pi fo \cdot t$, wherein $\phi$ is the angle of rotation of the rotatable device and $fo$ is the frequency of the auxiliary voltage of the angle indicator. In such known arrangement, a series of pulses are formed, utilizing suitable scanning circuits, from the analogue signal of the auxiliary voltages U1, U2 and a 90° phase shift of the series of pulses is effected. In addition thereto, a reference phase signal is produced and is compared with the signal derived from the original signal. Consequently, the known arrangement requires a very high outlay for effecting a determination of an angle transformation.

BRIEF SUMMARY OF THE INVENTION

The present invention has as its objective, to provide an arrangement, requiring a relatively low outlay, for transforming an analogue angle of rotation into digital values and to achieve therewith a sufficiently high accuracy resolution of the angle values.

In accordance with the invention, this objective is realized in a circuit arrangement of the general type heretofore referred to, in that from the two auxiliary voltages there is formed a third auxiliary voltage which contains either only the frequency $(fo+fa)$ or only the frequency $(fo-fa)$. The third auxiliary voltage and a comparison voltage of the frequency $n \cdot fo$ are conducted to a D-flip-flop operated as a comparator circuit, with the comparison voltage being supplied to the D-input (preparation input) and the third auxiliary voltage being present at the clock input, whereby the desired counter pulse train $n \cdot fa$ is derived at the output of the D-flip-flop.

BRIEF DESCRIPTION OF THE DRAWINGS

In the drawings wherein like reference characters indicate like or corresponding parts:

FIG. 1 illustrates an exemplary embodiment of a circuit arrangement in accordance with the invention; and FIGS. 2 a–d represent respective vector diagrams in connection with the explanation of the operation of the circuit illustrated in FIG. 1.

DETAILED DESCRIPTION OF THE INVENTION

Referring to FIG. 1, the antenna A represents a rotatable device which can, for example, preferably be employed in an all-around search radar device. The shaft W, by means of which the antenna may be rotated, is provided with a generator G which, in known manner, supplies two output voltages U1 and U2. The voltage U1 corresponds to the function $$U1(t) = \cos \phi (t) \cdot \cos 2\pi \cdot fo \cdot t \qquad 1.$$

The voltage U2 corresponds to the function $$U2(t) = \sin \phi (t) \cdot \cos 2\pi \cdot fo \cdot t \qquad 2.$$

where $\phi$ is the angle of rotation of the antenna, e.g. in relation to the north direction, and $fo$ is the auxiliary frequency of such a generator, which preferably is 400 Hz. Assuming that $\phi$ with $fa$ rotations per second can also be written as $$\phi = 2\pi \cdot fa \cdot t \qquad 3.$$

then equations (1) and (2) may be transformed as follows:

$$U1(t) = \cos (2\pi \cdot fa \cdot t) \cdot \cos 2\pi \cdot fo \cdot t \qquad 1a.$$

and $$U2(t) = \sin (2\pi \cdot fa \cdot t) \cdot \cos 2\pi \cdot fo \cdot t \qquad 2a.$$

By means of trigonometric transformations, there may be derived from the latter equations functions which are represented by $$U1(t) = \cos 2\pi (fo+fa) \cdot t + \cos 2\pi (fo-fa) \cdot t \qquad 1b.$$

and $$U2(t) = \sin 2\pi (fo+fa) \cdot t - \sin 2\pi (fo-fa) \cdot t \qquad 2b.$$

It will thus be noted that the voltages U1 and U2 contain signal mixtures of two frequencies which are represented by the frequency values $(fo+fa)$ and $(fo-fa)$. Consequently, if the antenna A effects one revolution per second and the frequency $fo = 400$ Hz, oscillations will occur having frequencies 401 and 399.

In order to ascertain merely one of the two oscillations, initially the other frequency component may be eliminated, and in the present example it is assumed that the frequency $fo-fa$ is to be so eliminated. This may be readily achieved by subjecting one of the voltages to a phase shift. For example, the auxiliary voltage U2 may be subjected to a 90° phase shift by a T element having ohmic resistance elements R4 (an adjustable resistance) and R5, which are disposed in the series arm while a capacitor C1 is disposed in the shunt arm. The voltage U1 similarly passes through a T element whose series resistances are designated R2 and R3 while the shunt element comprises an adjustable resistance designated R1. As this T element is composed solely of ohmic resistances it does not produce a phase shift but merely a change in amplitude.

The two voltages U1 and U2 are combined at the connection point, designated $\Sigma$, and as equal amplitudes are to be employed, the resistance R1 is adjustable. Likewise, by effecting a variation in the adjustable resistance R4 the desired phase shift of 90° of U2 with respect to U1 can be accurately determined. In many cases it may be expedient to employ a multi-stage RC circuit for phase shift purposes, and in actual practice, a three-stage circuit of this type has proved particularly effective.

As interference voltage peaks may exist at the interconnection point $\Sigma$, along with the voltages U1 and U2, a capacitance C2 is provided which discharges such interference voltages to ground. An ohmic resistance R7 is also connected between such connection point and ground and is operative to provide a low ohmic input resistance for the following comparator KV1.

FIG. 2 illustrates the manner in which the auxiliary voltage U3 is formed from the auxiliary voltages U1 and U2 at the interconnection point Σ.

FIG. 2 a) represents the auxiliary voltage U1 which is formed from two vectors U1n (lagging i.e. in accordance with $fo-fa$) and U1v (leading in accordance with $fo+fa$), which are rotating in opposite directions. In like manner, as illustrated in FIG. 2 b) the auxiliary voltage U2 is formed from the two vectors U2n (corresponding to $fo-fa$) and U2v (corresponding to $fo+fa$). FIG. 2 c) illustrates the position of the auxiliary voltage U2 following a 90° rotation and is designated U2' with the corresponding vectors designated U2'n and U2'v.

If the auxiliary subvoltages U1n, U1v, as illustrated in FIG. 2 a), and U2'v, U2'n as illustrated in FIG. 2 c) are superimposed at the interconnection point Σ, it will be apparent that the vectors U2'n and U1n are opposite in phase and thus, at equal amplitude values, mutually compensate one another. On the other hand, the two vectors U2'v and U1v are in phase with one another and become superimposed to form the third auxiliary voltage U3 which, in the present example, thus only has the frequency $fo+fa$.

It will be appreciated that if it is desired to eliminate the frequency $fo+fa$ and employ $fo-fa$ for the desired purposes, it would be necessary to rotate the auxiliary voltage U2 in phase not, by +90° (corresponding to FIG. 2 c)) but by −90° which, in such case, may be effective by the insertion of a capacitor in the series arm of the T element for the transmission path of U2. Likewise, the auxiliary voltage U2 could also be conducted to the connection point Σ without a phase shift and U1 could be rotated in phase by +90°.

In suitable manner, for example with the aid of a comparator KV1, the sinusoidal oscillations of the auxiliary voltage U3 may be transformed into rectangular oscillations of the same frequency $fo+fa$. Such rectangular oscillations pass to the clock-input of a comparator circuit VS which is constructed in the form of a D-flip-flop. D-flip-flops produced by Texas Instruments of the type SN 5474 or SN 7474, designed as integrated modules can, for example, be employed for this purpose. In the present instance, +1 is present at the clear-input (1) and at the preset-input (4) of the D-flip-flop.

The second data input D of the D-flip-flop VS likewise is supplied with rectangular oscillations U$d$ which have a frequency $n \cdot fo$, in which $n$ is the number of angle steps (counter pulses) into which a complete rotation of $\phi = 360°$ is to be quantised. Preferably values of 2 to the $k$ power are utilized for $n$. Thus, if it is assumed that $k=7$ is selected it would follow that $n=128$ and, consequently, with $fo = 400$ Hz, the frequency at the input D of the flip-flop must amount to $128 \cdot 400 = 51.2$ kHz.

In the present example, this frequency is produced by an oscillator CO which produces rectangular voltages and which preferably oscillates at a multiple of the frequency $nfo$, for example $2nfo$, from which an oscillation with the frequency $n \cdot fo$ may be derived by the employment of a frequency divider FT2. This has the advantage that, in a simple fashion, the keying ratio of the rectangular pulses remains uniform when formed in this manner. For the synchronization of the oscillator CO a further frequency divider FT1 may be utilized which divides the frequency of the oscillator CO in such a manner that the frequency $fo$ is applied to the phase comparator element PG. With the previously assumed frequency values the frequency divider FT1 must operate with a divider ratio of 128:1.

The phase element PG may be supplied, as comparison frequency, with the unmodulated auxiliary voltage $Uo = \sin 2\pi \cdot fo$ which is derived from the generator G and which was transformed into a rectangular wave by the comparator KV2. This frequency control circuit ensures the close interrelation, in terms of frequency, of the two voltages U3 and U$d$ which are conducted to the comparator circuit VS, with the result that the stability and accuracy of this circuit are improved.

The comparator circuit VS responds only to the rising front flanks of the rectangular pulses of the voltage U3 and thus monitors whether at such instant the rectangular voltage of U$d$ is zero or one. If U$d$ = 0, the output signal at Q (5) is also zero and remains so until a check establishes that U$d$ = 1 in which case the output (5) similarly remains at one.

The counter pulses Z1 so derived are conducted, for example, to a shift register WZ or further processed in suitable manner. Preferably the operation is such that the signal Z1, present at the output of the comparator circuit VS, is utilized as a pulse train for a shift register WZ which functions as a store into which items of data from the radar antenna are entered and, following the rotation of the antenna, or at a determinate earlier time, are extracted therefrom. Further details with respect to this type of operation are set forth in our copending application Ser. No. 517,221.

It will also be apparent that with a corresponding outlay it is also possible to derive the voltage U$d$ from the auxiliary voltage $Uo$ by means of frequency multiplication.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. In a circuit arrangement for the digitalization of an angle of rotation $\phi$ of a rotatable device which is operated at $fa$ rotations per second, employing auxiliary voltages modulated with the sin $\phi$ and the cos $\phi$ of a fundamental frequency $fo$, whereby, due to the modulation, said auxiliary voltages comprise respective mixtures of the frequency component $(fo-fa)$, and the frequency component $(fo-fa)$, the combination of means for effecting a phase shift of 90° of one of said auxiliary voltages, means for coupling the two auxiliary voltages (U1, U2) following such phase shift, whereby a third auxiliary voltage (U3), having the frequency of only one of said auxiliary frequency components remains, and a D-flip-flop (S), operating as a comparator circuit, to the clock input of which said third auxiliary voltage is supplied in the form of rectangular impulses, and to whose D-inputs a comparison voltage (U$d$) is applied, in the form of rectangular impulses having a frequency of $n \cdot fo$, whereby counter pulse trains (Z1) with a frequency of $n \cdot fa$ appear at the output of the D-flip-flop, in which $n$ corresponds to the angle of rotation equal to $\phi$ 360° and represents a power of 2.

2. A circuit arrangement according to claim 1, comprising in further combination a capacitor (C2) extending between the interconnection point (Σ) of the auxiliary voltages (U1, U2) and ground, operable to eliminate interference voltages.

3. A circuit arrangement according to claim 1, wherein the two voltages are added together at an interconnection point (Σ) and that prior to such interconnection point adjustable resistances (R1, R4) are provided which enable accurate setting of the amplitude and the 90° phase relationships desired, whereby the two voltages (U1, U2) are of equal amplitudes at time of addition.

4. A circuit arrangement according to claim 3, comprising in further combination a capacitor (C2) extending between the interconnection point (Σ) of the auxiliary voltages (U1, U2) and ground, operable to eliminate interference voltages.

5. A circuit arrangement according to claim 4, wherein the 90° phase shift is effected by a three-stage RC circuit.

6. A circuit arrangement according to claim 1, wherein means are provided whereby the respective input voltages (U3, Ud) of the D-flip-flop are supplied thereto in the form of rectangular voltages.

7. A circuit arrangement according to claim 1, wherein the 90° phase shift is effected by a three-stage RC circuit.

8. A circuit arrangement according to claim 5, wherein means are provided whereby the respective input voltages (U3, Ud) of the D-flip-flop are supplied thereto in the form of rectangular voltages.

9. A circuit arrangement according to claim 8, comprising in further combination an oscillator (CO) which is operable to generate the comparison voltage (Ud).

10. A circuit arrangement according to claim 1, comprising in further combination an oscillator (CO) which is operable to generate the comparison voltage (Ud).

11. A circuit arrangement according to claim 9, wherein means are provided for synchronizing the oscillator (CO) with the fundamental frequency $fo$ of the unmodulated auxiliary voltage (Uo).

12. A circuit arrangement according to claim 10, wherein means are provided for synchronizing the oscillator (CO) with the fundamental frequency $fo$ of the unmodulated auxiliary voltage (Uo).

13. A circuit arrangement according to claim 12, wherein the oscillator (CO) oscillates at a frequency of $n \cdot m \cdot fo$ wherein $m$ is a whole number, preferably $m=2$.

14. A circuit arrangement according to claim 10, wherein the oscillator (CO) oscillates at a frequency of $n \cdot m \cdot fo$ wherein $m$ is a whole number, preferably $m=2$.

15. A circuit arrangement according to claim 1, wherein the comparison voltage (Ud) is obtained by frequency multiplication from the unmodulated auxiliary voltage (Uo).

16. A circuit arrangement according to claim 1, wherein such circuit forms an angle counter for an antenna, particularly for an all-around search radar device.

17. A circuit arrangement according to claim 1, comprising in further combination shift register (WZ) with the signal (ZI) appearing at the output of the comparator circuit (VS) being utilized as a pulse train for such shift register, which functions as a store, and into which data from the radar antenna is entered and, following a rotation of the antenna or at a defined earlier point, is extracted therefrom.

* * * * *